United States Patent
Yu et al.

(10) Patent No.: US 9,734,883 B1
(45) Date of Patent: Aug. 15, 2017

(54) REFERENCE CIRCUIT AND MRAM

(71) Applicant: Taiwan Semiconductor Manufacturing Co., Ltd., Hsinchu (TW)

(72) Inventors: Chwen Yu, Taipei (TW); Shy-Jay Lin, Jhudong Township, Hsinchu County (TW); William J. Gallagher, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/261,242

(22) Filed: Sep. 9, 2016

(51) Int. Cl.
*G11C 13/00* (2006.01)
*G11C 11/16* (2006.01)
*H01L 27/22* (2006.01)

(52) U.S. Cl.
CPC ........ *G11C 11/1673* (2013.01); *G11C 11/161* (2013.01); *H01L 27/228* (2013.01); *G11C 13/0002* (2013.01); *G11C 13/0004* (2013.01)

(58) Field of Classification Search
CPC ............ G11C 13/0002; G11C 13/0004; G11C 11/161; H01L 27/228
USPC ... 365/158, 148, 163, 210.1, 210.11, 210.14, 365/210.15
See application file for complete search history.

(56) References Cited

U.S. PATENT DOCUMENTS 7,952,916 B2 * 5/2011 Maeda .................... G11C 11/16
365/158
2016/0019943 A1 1/2016 Chih et al.

OTHER PUBLICATIONS

Kim et al., "A Covalent-Bonded Cross-Coupled Current-Mode Sense Amplifier for STT-MRAM with 1T1MTJ Common Source-Line Structure Array", IEEE, 2015, 5 pages.
Maffitt et al., "Design Considerations for MRAM", IBM J. Res. & Dev, Jan. 2006, vol. 50, No. 1, pp. 25-39.
Na et al., "Reference-Scheme Study and Novel Reference Scheme for Deep Submicrometer STT-RAM", IEEE Transactions on Circuits and Systems-I: Regular Papers, Dec. 2014, vol. 61, No. 12, pp. 3376-3385.
Zhang et al., "A 16 Kb Spin-Transfer Torque Random Access Memory With Self-Enable Switching and Precharge Sensing Schemes", IEEE Transactions on Magnetics, Apr. 2014, vol. 50, No. 4, 7 pages.

* cited by examiner

*Primary Examiner* — Tan T. Nguyen
(74) *Attorney, Agent, or Firm* — Birch, Stewart, Kolasch & Birch, LLP

(57) ABSTRACT

A reference circuit for a magnetic random access memory (MRAM) is provided. The reference circuit includes a plurality of device strings coupled in parallel. Each of the device strings includes a plurality of magnetic tunnel junction (MTJ) devices coupled in serial. A quantity of MTJ devices of each of the device strings is equal to a quantity of device strings. An equivalent resistance of the MTJ devices is equal to the resistance of one of the MTJ devices.

20 Claims, 7 Drawing Sheets

REFERENCE CIRCUIT AND MRAM

BACKGROUND

An MRAM (magnetic random access memory) is a form of non-volatile memory capable of storing bits of digital information ("0" or "1"). In the MRAM, digital data is not stored as an electrical charge as it is in traditional RAM components, but rather the bit state ("0" or "1") is stored via resistive states (high resistance or low resistance) in magnetic storage elements which do not require constant electrical power to retain their state.

MRAM may be a cost-effective solution for long-term data retention and rapid on/off applications such as mobile devices and general consumer electronic systems. Compared with static random access memory (SRAM) and flash memory, MRAM can provide fast, low-power, nonvolatile storage.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
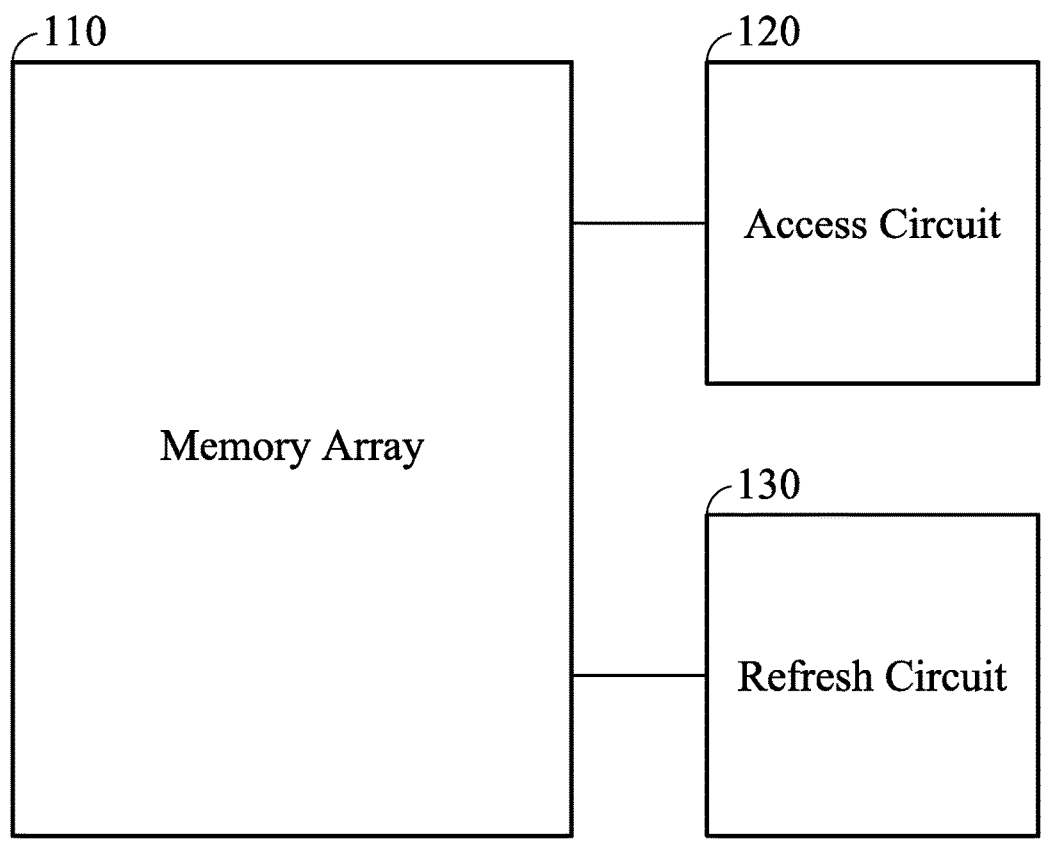
FIG. 1 shows a magnetic random access memory (MRAM), in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

FIG. 1 shows a magnetic random access memory (MRAM) 100, in accordance with some embodiments of the disclosure. The MRAM 100 includes a memory array 110, an access circuit 120, and a refresh circuit 130. The memory array 110 is formed by a plurality of memory cells arranged in a plurality of rows and a plurality of columns. Each memory cell includes a magnetic tunnel junction (MTJ) device. The access circuit 120 includes the circuits for accessing the memory array 110, such as a row decoder, a column decoder, a sense circuit having a plurality of sense amplifiers, and a writing circuit having a plurality of writing drivers. According to the address information, the access circuit 120 is capable of reading data from the memory array 110 or writing data into the memory array 110. The refresh circuit 130 is capable of periodically performing a refresh process, so as to refresh a plurality of specific memory cells of the memory array 110. In some embodiments, the refresh process is performed by the writing circuit of the access circuit 120.

Figure 2A:
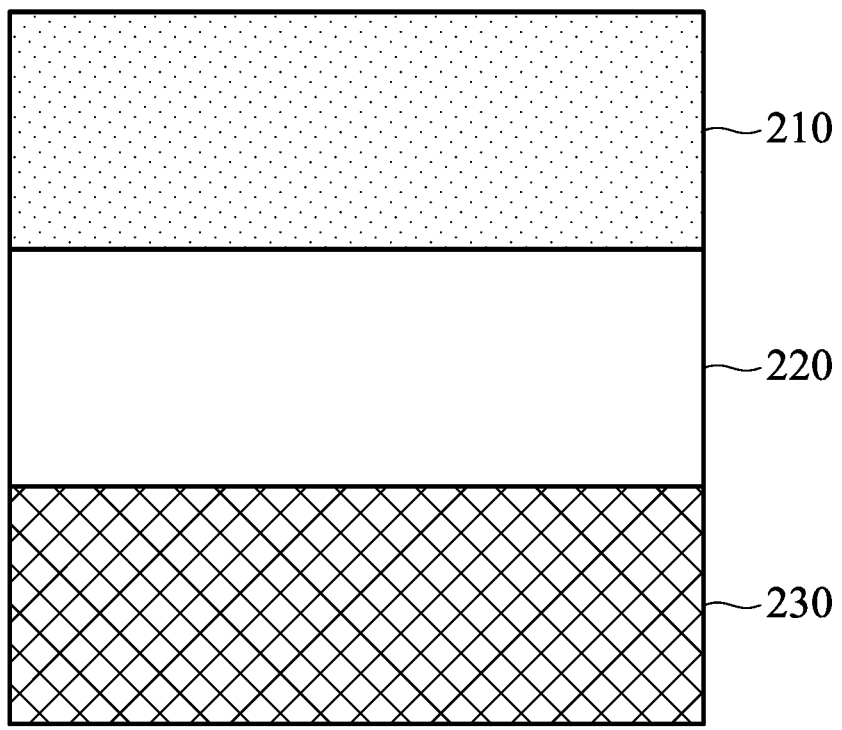
FIG. 2A shows an example of an MTJ device of a memory cell in the MRAM 100 of FIG. 1, in accordance with some embodiments of the disclosure.

FIG. 2A shows an example of an MTJ device 200 of a memory cell in the MRAM 100 of FIG. 1, in accordance with some embodiments of the disclosure. The MTJ device 200 includes at least the following layers: a free layer 210, a spacer 220 which serves as a tunneling barrier, and a pinned layer 230. In each memory cell of the MRAM 100, the pinned layer 230 has a fixed magnetization direction (or magnetic orientation). Furthermore, the free layer 210 has a magnetization direction that, with the application of a spin torque caused by a current through the MTJ device 200, can be switched between a first direction, which is parallel to the magnetization direction of the pinned layer 230 (i.e. a parallel magnetic state), and a second direction opposite to the first direction. The second direction is anti-parallel to the magnetization direction of the pinned layer 230 (i.e. an anti-parallel magnetic state).

The tunneling barrier 220 is disposed between the pinned layer 230 and the free layer 210. The tunneling barrier 220 is composed of insulating material, for example aluminum oxide, magnesium oxide, or tantalum oxide. The tunneling barrier 220 is formed thin enough to allow the transfer (tunneling) of spin-aligned electrons when the magnetization directions of the free layer 210 and the pinned layer 230 are parallel. On the other hand, when the magnetization directions of the free layer 210 and the pinned layer 230 are anti-parallel, the probability of electrons tunneling through the tunneling barrier 220 is reduced.

Figure 2B:
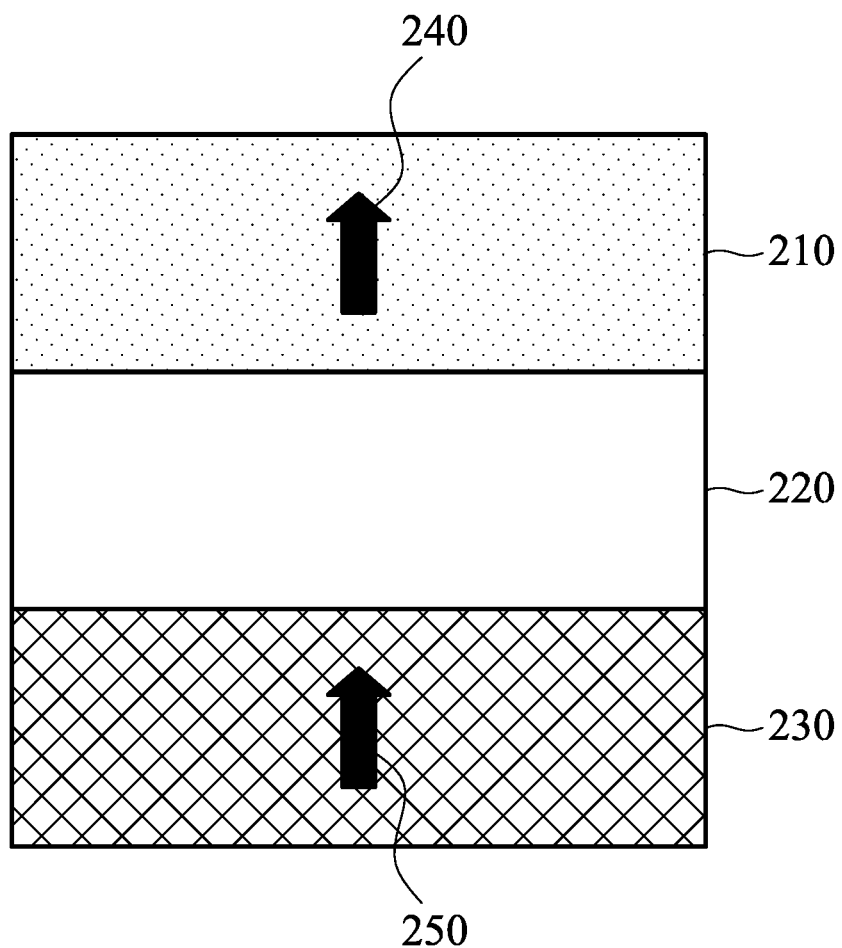
FIG. 2B shows a parallel magnetic state of an MTJ device.

FIG. 2B shows a parallel magnetic state of an MTJ device 200A. In the MTJ device 200A, the free layer 210 has a magnetization direction 240 from the pinned layer 230 to the free layer 210. Furthermore, the pinned layer 230 has a magnetization direction 250 from the pinned layer 230 to the free layer 210. Due to the magnetization direction 240 being parallel to the magnetization direction 250, the MTJ device 200A is in a parallel magnetic state with a low resistance Rp. The resistance of the MTJ device 200A is decreased when the magnetization directions 240 and 250 become more parallel.

Figure 2C:
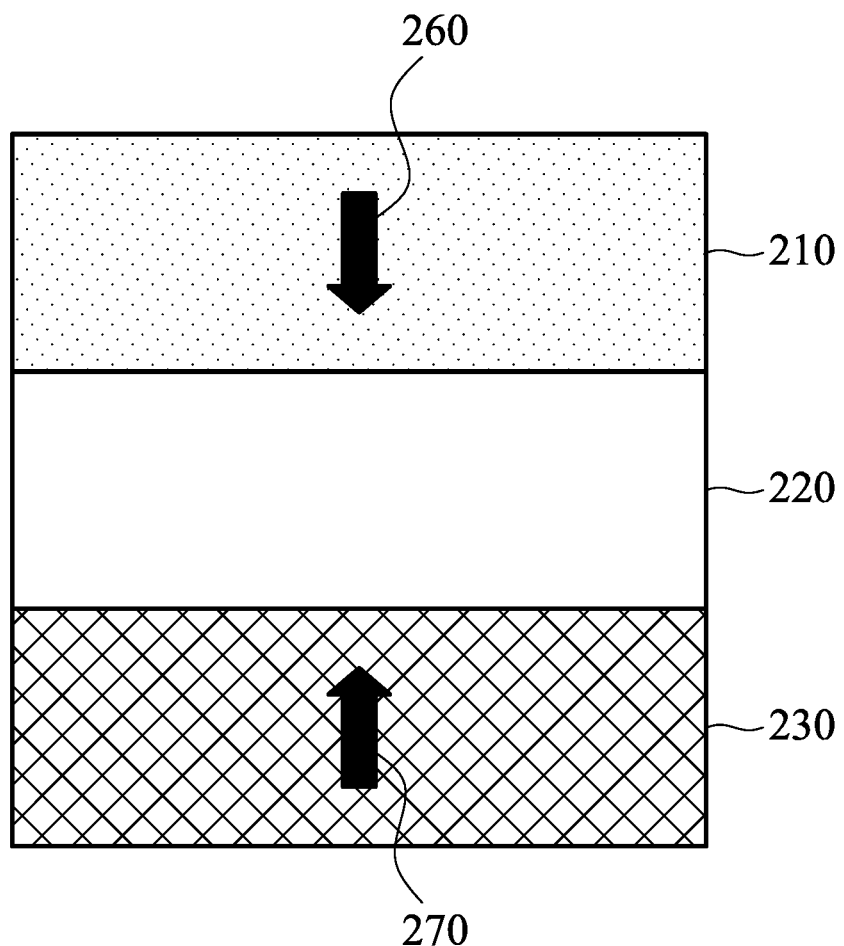
FIG. 2C shows an anti-parallel magnetic state of an MTJ device.

FIG. 2C shows an anti-parallel magnetic state of an MTJ device 200B. In the MTJ device 200B, the free layer 210 has a magnetization direction 260 from the free layer 210 to the pinned layer 230. Furthermore, the pinned layer 230 has a magnetization direction 270 from the pinned layer 230 to the free layer 210. Due to the magnetization direction 260 being anti-parallel to the magnetization direction 270, the MTJ device 200B is in an anti-parallel magnetic state with a high resistance Rap. The resistance of the MTJ device 200B is increased when the magnetization directions 260 and 270 become more anti-parallel.

In each memory cell of an MRAM, the resistance of the MTJ device can be switched between the high resistance Rap and the low resistance Rp that respectively represent first and second logic levels. For example, the high resistance Rap of an anti-parallel magnetic state can represent a high logic level (i.e. "1"), and the low resistance Rp of a parallel magnetic state can represent a low logic state (i.e. "0"). Thus, by controlling the magnetization directions of the free layer 210 and the pinned layer 230 of a memory cell with a writing current, a bit ("1" or "0") of data is stored in the memory cell. Furthermore, the logic level of data stored in the memory cell can be read by passing a sense current through the MTJ device of the memory cell and then sensing the resistance of the MTJ device.

Figure 3:
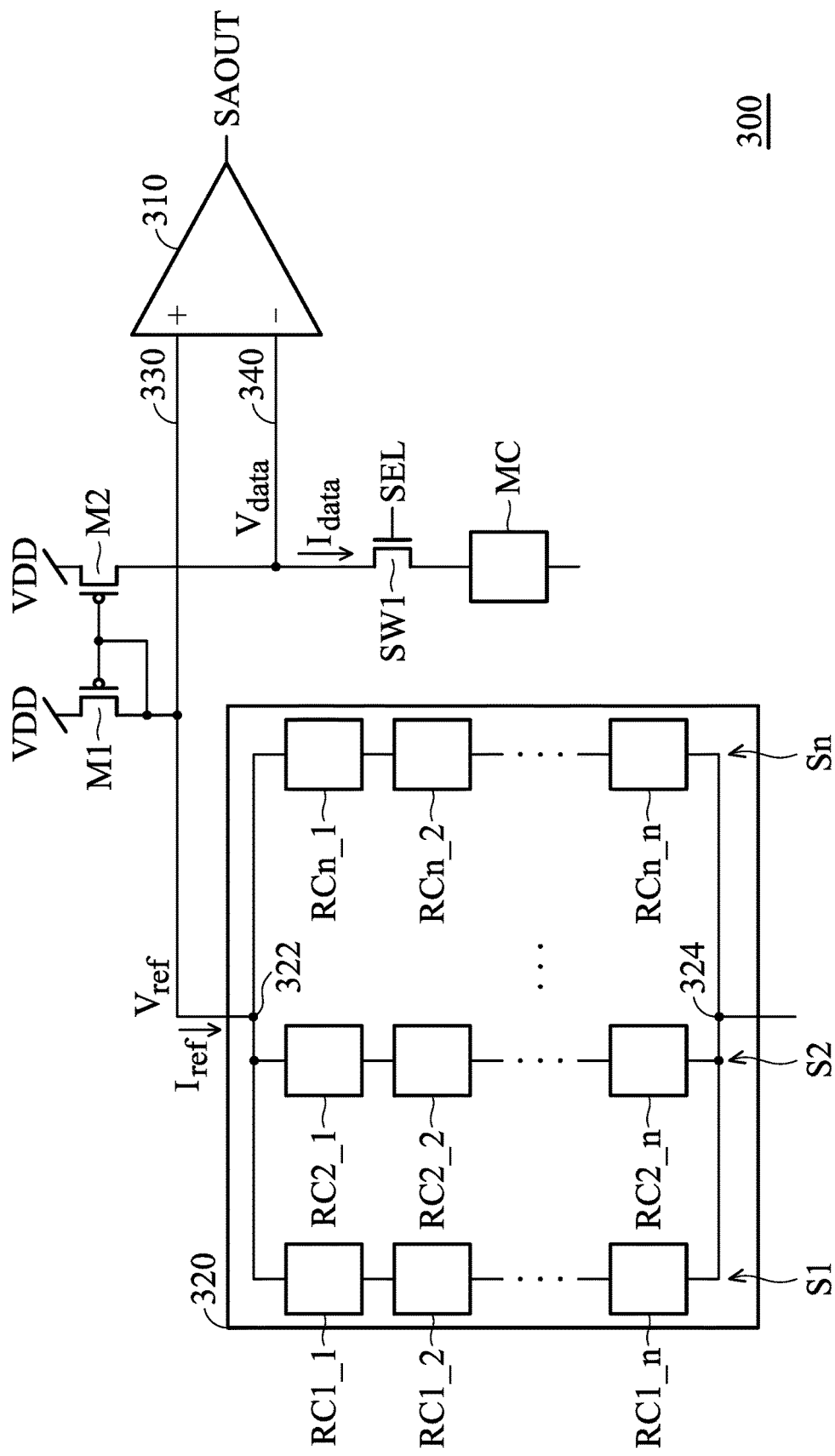
FIG. 3 shows an MRAM, in accordance with some embodiments of the disclosure.

FIG. 3 shows an MRAM 300, in accordance with some embodiments of the disclosure. The MRAM 300 includes a sense amplifier 310, a reference circuit 320, a switch SW1, a target cell MC, and two transistors M1 and M2. The sense amplifier 310 has an inverting input terminal coupled to a bit line 340, a non-inverting input terminal coupled to a reference line 330, and an output terminal. In some embodiments, the sense amplifier 310 is implemented in an access circuit of the MRAM 300. In order to simplify the description, other circuits (e.g. the access circuit) of the MRAM 300 are omitted in FIG. 3. According to a voltage/current difference between the bit line 340 and the reference line 330, the sense amplifier 310 is capable of providing an output signal SAOUT at the output terminal thereof. It should be noted that the connection relationship of the input terminals of the sense amplifier 310, the bit line 340 and reference line 330 is used as an example, and not to limit the disclosure. In some embodiments, the inverting input terminal of the sense amplifier 310 is coupled to the reference line 330, and the non-inverting input terminal of the sense amplifier 310 is coupled to the bit line 340.

The target cell MC is a memory cell to be read in a memory array of the MRAM 300. In order to simplify the description, only the target memory cell is illustrated, and the remaining memory cells capable of storing data are omitted in FIG. 3. The switch SW1 is coupled between the bit line 340 and the target cell MC, and the switch SW1 is controlled by a select signal SEL. When the target cell MC is selected for reading, the switch SW1 is turned on by the select signal SEL. The switch SW1 is further coupled to a drain of the transistor M2 and the inverting input terminal of the sense amplifier 310. As described above, the target cell MC includes an MTJ device. The reference circuit 320 includes a plurality of reference cells RC1_1-RCn_n. The reference cells RC1_1-RCn_n form a plurality of device strings S1-Sn coupled in parallel between the nodes 322 and 324, and the reference cells of the same device string are coupled in serial. For example, the reference cells RC1_1-RC1_n are coupled in serial in the device string S1, the reference cells RC2_1-RC2_n are coupled in serial in the device string S2, . . . , and the reference cells RCn_1-RCn_n are coupled in serial in the device string Sn. Similarly, each of the reference cells RC1_1-RCn_n includes an MTJ device. Furthermore, the MTJ devices of the reference cells RC1_1-RCn_n are pre-set to the same magnetic state, e.g. an anti-parallel magnetic state or a parallel magnetic state.

In some embodiments, each of the device strings S1-Sn has the same amount of reference cells. For example, the quantity of reference cells RC1_1-RC1_n in the device string S1 is n, and the quantity of reference cells RC2_1-RC2_n in the device string S2 is also n. Furthermore, the quantity of device strings S1-Sn is equal to the quantity of reference cells in each of the device strings S1-Sn. For example, the quantity of device strings S1-Sn is n.

In some embodiments, the reference cells are a portion of the memory cells in the memory array of the MRAM 300, and the portion of the memory cells form a sub-array in the memory array. Thus, the target cell MC and the reference cells are all disposed in the memory array. In some embodiments, the reference cells are the memory cells disposed outside the memory array.

The transistors M1 and M2 are the PMOS transistors. The transistor M1 is coupled between a power source VDD and the reference line 330, and a gate of the transistor M1 is coupled to the reference line 330. The transistor M2 is coupled between the power source VDD and the bit line 340, and a gate of the transistor M2 is coupled to the reference line 330.

When the target cell MC is selected for reading the data stored in the target cell MC, the select signal SEL controls the switch SW1 to turn on. Thus, a sense current $I_{data}$ from the transistor M2 is passed through the target cell MC, so as to sense the resistance of the target cell MC. Therefore, a voltage $V_{data}$ corresponding to the sense current $I_{data}$ and the resistance of the target cell MC is provided to the inverting input terminal of the sense amplifier 310. Simultaneously, a reference current $I_{ref}$ from the transistor M1 is passed through the reference circuit 320, and a voltage $V_{ref}$ corresponding to the reference current $I_{ref}$ and an equivalent resistance of the reference circuit 320 is provided to the non-inverting input terminal of the sense amplifier 310. Thus, the sense amplifier 310 can compare the voltage $V_{data}$ with the voltage $V_{ref}$ to determine the resistance state of the target cell MC, and provide the output signal output signal SAOUT to indicate a logic level of data stored in the target cell MC.

In some embodiments, an MRAM may include a plurality of reference circuits coupled in parallel. Each reference circuit is capable of providing an equivalent resistor, wherein the equivalent resistor is substantially equal to an individual specific resistance, such as a low resistance Rp corresponding to a parallel magnetic state or a high resistance Rap corresponding to an anti-parallel magnetic state. In some embodiments, the specific resistances of the reference circuits are the same. In some embodiments, the equivalent resistors of a portion of the reference circuits are substantially equal the low resistance Rp, and the equivalent resistors of remaining reference circuits are substantially equal the high resistance Rap.

Figure 4:
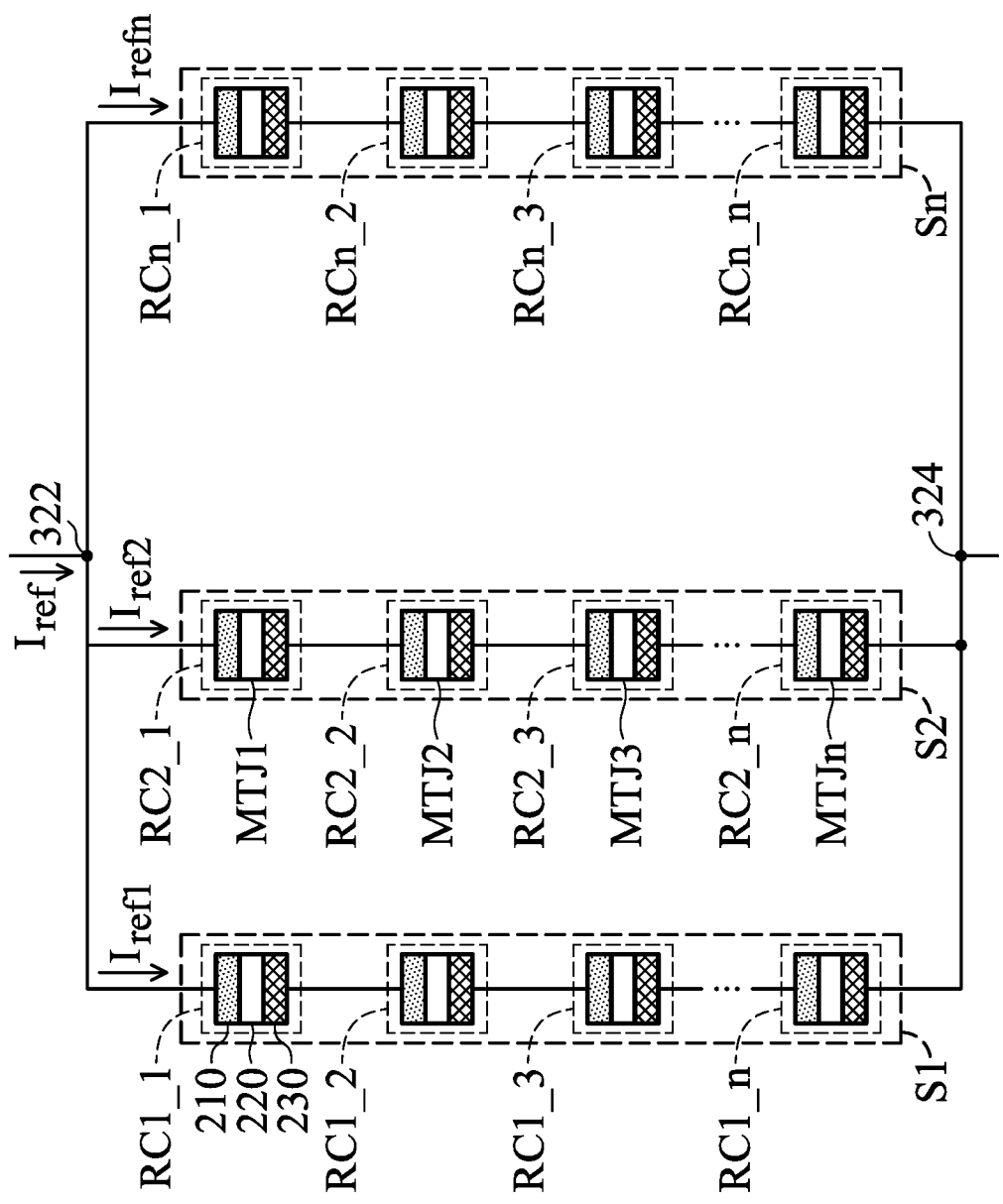
FIG. 4 shows an example of the connection relationship of the MTJ devices of the reference cells in the reference circuit of FIG. 3.

FIG. 4 shows an example of the connection relationship of the MTJ devices of the reference cells RC1_1-RCn_n in the reference circuit 320 of FIG. 3. Each of the reference cells RC1_1-RCn_n includes a single MTJ device. Furthermore, the MTJ device includes at least a free layer 210, a tunneling barrier 220, and a pinned layer 230. In the embodiment, for each of the device strings S1-Sn, the free layer 210 of a first MTJ device is coupled to the node 322, and the pinned layer 230 of the last MTJ device is coupled to the node 324. For example, the free layer 210 of the MTJ devices of the reference cells RC1_1, RC2_1, RCn_1 are coupled to the node 322 together, and the pinned layer 230 of the MTJ devices of the reference cells RC1_n, RC2_n, RCn_n are coupled to the node 324 together.

For each of the device strings S1-Sn, the free layer 210 of each of the MTJ devices is coupled to the pinned layer 230 of the adjacent MTJ device except the first and last MTJ devices. Taking the device string S2 as an example, the device string S2 includes the reference cells RC2_1-RC2_$n$ coupled in serial, and each reference cell includes a respective MTJ device, e.g. MTJ1, MTJ2, . . . or MTJn. The MTJ device MTJ1 is a first MTJ device disposed in the head of the device string S2, and the MTJ device MTJn is the last MTJ device disposed in the tail of the device string S2. The free layer 210 of the MTJ device MTJ1 is coupled to the node 322, and the pinned layer 230 of the MTJ device MTJ1 is coupled to the free layer 210 of the MTJ device MTJ2. Furthermore, the free layer 210 of the MTJ device MTJ3 is coupled to the pinned layer 230 of the MTJ device MTJ2, and the pinned layer 230 of the MTJ device MTJ3 is coupled to the free layer 210 of the MTJ device MTJ4 (not shown), and so on. The free layer 210 of the MTJ device MTJn is coupled to the pinned layer 230 of the MTJ device MTJ(n–1) (not shown), and the pinned layer 230 of the MTJ device MTJn is coupled to the node 324.

Before the target cell MC is read, the MTJ devices of the reference cells RC1_1-RCn_n are simultaneously pre-set to a specific magnetic state, such as a parallel magnetic state or an anti-parallel magnetic state. Thus, the MTJ device of each reference cell has a specific resistance corresponding to the specific magnetic state, such as a low resistance Rp corresponding to a parallel magnetic state or a high resistance Rap corresponding to an anti-parallel magnetic state.

Assuming that the reference cells RC1_1-RCn_n are simultaneously pre-set to a parallel magnetic state, each reference cell has a low resistance Rp. Thus, each of the device strings S1-Sn has an equivalent resistance Rs, i.e. Rs=N×Rp. Furthermore, the device strings S1-Sn are coupled in parallel, and an equivalent resistor Req of the reference circuit 320 is substantially equal to the low resistance Rp, i.e. Req=Rs//Rs//Rs// . . . //Rs=Rp. Specifically, the reference circuit 320 functions as a single reference cell.

The resistance of an MTJ device of the reference circuit 320 will be changed once retention failure or read disturbance failure occurs. As described above, when the magnetization direction of the MTJ device of the single reference cell is changed, for example, from a parallel magnetic state to an anti-parallel magnetic state or from an anti-parallel magnetic state to a parallel magnetic state, the resistance of the single reference cell is increased or decreased accordingly.

Retention failures are bit storage failures that occur when a bit's net magnetization direction spontaneously switches state due to thermally excited fluctuations of the magnetization direction. Retention failures depend on temperature in an activated manner according to well-known physical laws. Activated bit reversal rates (raw retention failures) are well characterized during chip development and monitored during manufacturing. The rates of thermally activated switching events are part of the specifications involved in memory design. For example, a specification is set for the maximum mean time between failures (MTBF) of bits as a function of temperature. According to the activation rate and its temperature dependence from technology characterization specifications, the MTBF is obtained for bits of an MRAM. Furthermore, a refresh frequency of a refresh process is determined according to the MTBF. In response to the refresh frequency, a refresh circuit (e.g. 130 of FIG. 1) can periodically provide a refresh current to refresh all MTJ devices of the reference circuit 320, so as to correct thermally activated retention errors. Thus, all MTJ devices of the reference circuit 320 are rewritten to the correct state. In the refresh process, the failed MTJ devices don't need to be identified.

Read disturbance failure represents the magnetic state of the MTJ device being changed when a current is passing through the MTJ for reading, i.e. the MTJ device to be read is written to its opposite magnetic state. The rate of read disturbance failures under normal operating conditions is generally very low. The rate needs to be characterized by extrapolating write rates with high current to expected rates at low currents based on the known physics of magnetization switching due to current drive. By keeping track of the number of read cycles, the expected number of read disturbance failures can be calculated by using the extrapolated read disturbance failure rates. In FIG. 4, the reference current $I_{ref}$ is diverted to the device strings S1-Sn of the reference circuit 320, and then the currents $I_{ref1}$-$I_{refn}$ are passing through the device strings S1-Sn. In some embodiments, the currents $I_{ref1}$-$I_{refn}$ are smaller than the sense current $I_{data}$. Thus, read disturbance failure is decreased for the MTJ devices of the device strings S1-Sn. Furthermore, in response to the refresh frequency, a refresh circuit (e.g. 130 of FIG. 1) can periodically provide a refresh current to refresh all MTJ devices of the reference circuit 320, so as to correct errors caused by read disturbance failure. Thus, all MTJ devices of the reference circuit 320 are rewritten to the correct state.

Compared with the single reference cell, by connecting the reference cells of the reference circuit 320 in parallel and in serial, an equivalent resistor Req is provided for the reference circuit 320, wherein the equivalent resistance Req is equal to the resistance of the single reference cell. Thus, when the magnetization direction of the MTJ device of any reference cell is changed in the reference circuit 320, the equivalent resistance Req will still be approximate to the resistance of the single reference cell.

For example, it is assumed that one of the MTJ devices of the reference circuit 320 flips to a high resistance Rap from a low resistance Rp caused by retention failures or read disturbance failures. If the high resistance Rap is twice as big as the low resistance Rp, the equivalent resistance Req is obtained according to the following equations:

$$\frac{1}{Req} = \frac{1}{n \times Rp + Rap} + \frac{1}{n \times Rp} \times (n-1) =$$

$$\frac{1}{(n+1) \times Rp} + \frac{(n-1)}{n \times Rp} = \frac{n^2 + n - 1}{n \times (n+1) \times Rp}$$

wherein $$Req = \frac{n^2 + n}{n^2 + n - 1} \times Rp.$$

If n=10, Req=110Rp/109=1.0092Rp. Thus, it is a very small deviation for the equivalent resistance Req.

Figure 5:
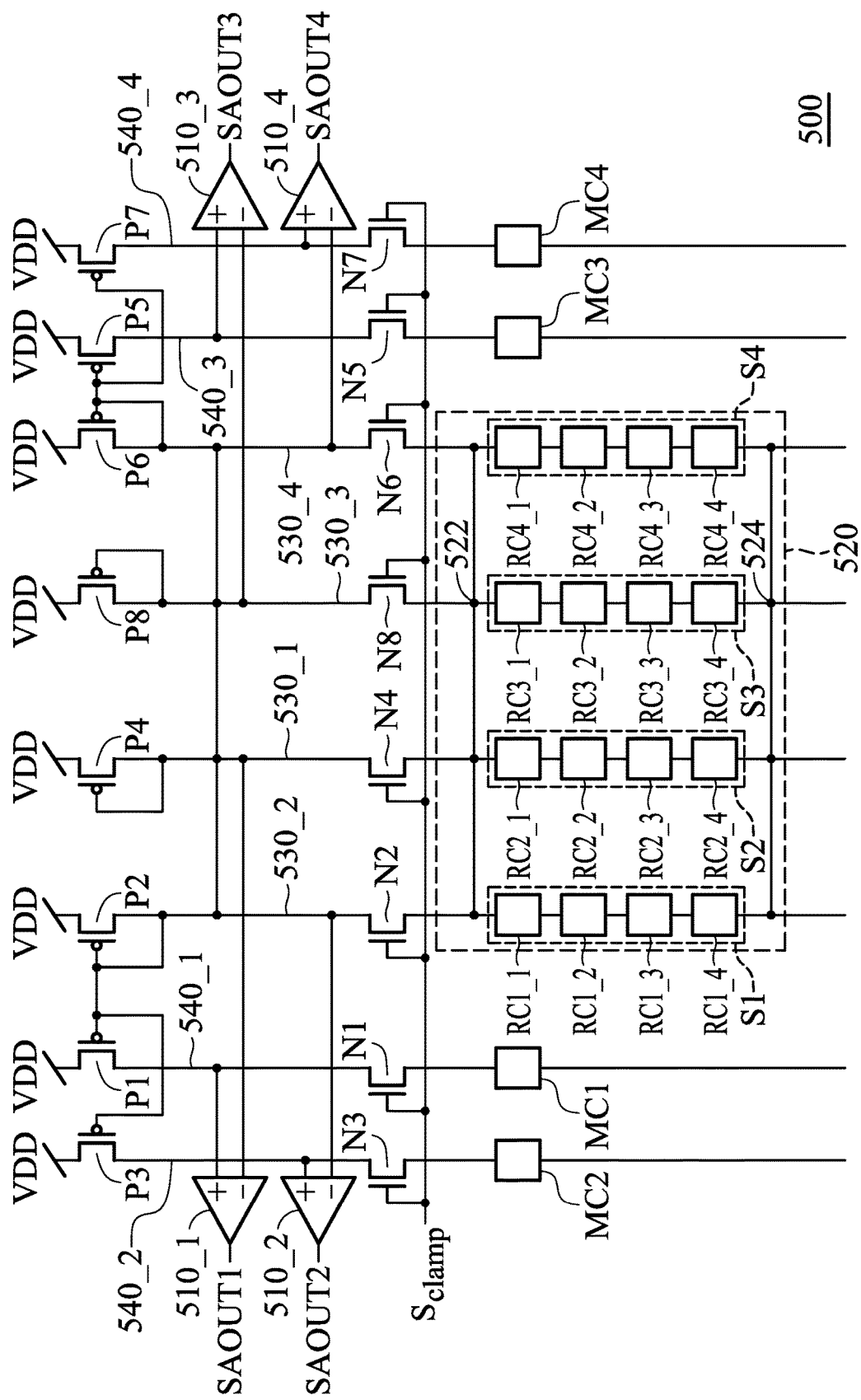
FIG. 5 shows an MRAM, in accordance with some embodiments of the disclosure.

FIG. 5 shows an MRAM 500, in accordance with some embodiments of the disclosure. The MRAM 500 includes a plurality of sense amplifiers 510_1-510_4, a reference circuit 520, a plurality of NMOS transistors N1-N8, a plurality of target cells MC1-MC4, and a plurality of PMOS transistors P1-P8. In the embodiment, the reference circuit 520 is shared between the sense amplifiers 510_1-510_4. Each of the sense amplifiers 510_1-510_4 has an inverting input terminal coupled to an individual reference line, a non-inverting input terminal coupled to an individual bit line, and an output terminal. For example, the inverting input terminal of the sense amplifier 510_1 is coupled to the reference line 530_1, and the non-inverting input terminal of the sense amplifier 510_1 is coupled to the bit line 540_1. It should be noted that the connection relationship of the input terminals of the sense amplifiers 510_1-510_4, the bit lines 540_1-540_4 and reference lines 530_1-530_4 is used as an example, and not to limit the disclosure. In some embodiments, the inverting input terminals of the sense amplifiers 510_1-510_4 are coupled to the bit lines 540_1-540_4, and the non-inverting input terminals of the sense amplifiers 510_1-510_4 are coupled to the reference lines 530_1-530_4. In some embodiments, the sense amplifiers 510_1-510_4 are implemented in an access circuit (not shown) of the MRAM 500. Each of the sense amplifiers 510_1-510_4 is capable of providing an output signal at the output terminal thereof according to a voltage/current difference between the corresponding bit line and the corresponding reference line.

Each of the target cells MC1-MC4 is a memory cell to be read in a memory array of the MRAM 500. In order to simplify the description, only the target memory cell is illustrated, and the remaining memory cells capable of storing data are omitted in the memory array of the MRAM 500. As described above, the target cells MC1-MC4 each include an MTJ device.

The NMOS transistors N1, N3, N5 and N7 are coupled between the corresponding bit lines and the corresponding target cells, and are controlled by a clamp signal $S_{clamp}$. For example, the NMOS transistor N1 is coupled between the bit line 540_1 and the target cell MC1. The NMOS transistors N2, N4, N6 and N8 are coupled between the corresponding reference lines and the corresponding device string of the reference circuit 520, and are also controlled by the clamp signal $S_{clamp}$. For example, the NMOS transistor N2 is coupled between the reference line 530_2 and the device string S2 of the reference circuit 520.

During a read operation, the bit lines 540_1-540_4 are kept at a constant potential by the NMOS transistors N1, N3, N5 and N7. Similarly, the reference lines 530_1-530_4 are kept at a constant potential by the NMOS transistors N2, N4, N6 and N8. Thus, the speed of sensing the resistances of the target cells and the reference cells of the reference circuit 520 are increased.

The PMOS transistors P1, P3, P5 and P7 are coupled between the power source VDD and the corresponding bit lines 540_1-540_4, respectively. The PMOS transistors P2, P4, P6 and P8 are coupled between the power source VDD and the corresponding reference lines 530_1-530_4, respectively. The gate of each of the PMOS transistors P2, P4, P6 and P8 is coupled to the drain thereof. Furthermore, the gates of the PMOS transistors P1-P3 are connected together, and the gates of the PMOS transistors P5-P7 are connected together.

The reference circuit 520 includes a plurality of reference cells RC1_1-RC4_4, such as 4×4 array. The reference cells RC1_1-RC4_4 form a plurality of device strings S1-S4 coupled in parallel between the nodes 522 and 524, and the reference cells of the same device string are coupled in serial. For example, the reference cells RC1_1-RC1_4 are coupled in serial in the device string S1, the reference cells RC2_1-RC2_4 are coupled in serial in the device string S2, the reference cells RC3_1-RC3_4 are coupled in serial in the device string S3, and the reference cells RC4_1-RC4_4 are coupled in serial in the device string S4. Similarly, each of the reference cells RC1_1-RC4_4 includes an MTJ device.

In some embodiments, each of the device strings S1-S4 has the same amount of reference cells. For example, the quantity of reference cells RC1_1-RC1_4 in the device string S1 is 4, and the quantity of reference cells RC2_1-RC2_4 in the device string S2 is also 4. Furthermore, the quantity of device strings S1-S4 is equal to the quantity of reference cells in each of the device strings S1-S4. For example, the quantity of device strings S1-S4 is 4. Furthermore, the MTJ devices of the reference cells RC1_1-RC4_4 are pre-set to the same magnetic state, e.g. an anti-parallel magnetic state or a parallel magnetic state.

In some embodiments, the quantity of device strings is different from the quantity of reference cells in each of the device strings. Furthermore, half of the MTJ devices of the reference circuit 520 are pre-set to a parallel magnetic state, and the other half of the MTJ devices of the reference circuit 520 are pre-set to an anti-parallel magnetic state In some embodiments, the reference cells are a portion of the memory cells in the memory array of the MRAM 500, and the portion of the memory cells form a sub-array in the memory array. Thus, the target cell MC and the reference cells are all disposed in the memory array. In some embodiments, the reference cells are the memory cells disposed outside the memory array.

As described above, a refresh circuit (e.g. 130 of FIG. 1) can periodically provide a refresh current to refresh all MTJ devices of the reference circuit 520, so as to correct errors caused by read disturbance failures or Retention failures. Thus, all MTJ devices of the reference circuit 520 are rewritten to the correct state. Based on the tolerance of the reference cells of the reference circuit 520 of the disclosure to small numbers of the MTJ devices, the frequency of the refresh process that is performed to correct errors can be calculated.

Embodiments of MRAM including a reference circuit are provided. The reference circuit includes a plurality of reference cells, and the reference cells form a plurality of device strings coupled in parallel. The reference cells and the target cells have the same MTJ structure. In some embodiments, the reference cells and the target cells are disposed in the same memory array. Thus, process deviation would be small, and read disturbance failure is also decreased. In some embodiments, the quantity of reference cells in each device string is equal to the quantity of device strings. Furthermore, an equivalent resistance of the reference cells of the reference circuit is equal to a single reference cell when all of the reference cells of the reference circuit are in the same magnetic state with a specific resistance, e.g. a parallel magnetic state with a low resistance Rp or an anti-parallel magnetic state with a high resistance Rap. In some embodiments, the quantity of reference cells in each device string is different from the quantity of device strings. Furthermore, half of the reference cells of the reference circuit are in a parallel magnetic state with a low resistance Rp, and the other half of the reference cells of the reference circuit are in an anti-parallel magnetic state with a high resistance Rap. Specifically, the reference circuits of the embodiments are more robust than a single reference cell. In some embodiments, the reference circuit can be shared between various sense amplifiers.

In some embodiments, a reference circuit for a magnetic random access memory (MRAM) is provided. The reference circuit includes a plurality of device strings coupled in parallel. Each of the device strings includes a plurality of magnetic tunnel junction (MTJ) devices coupled in serial.

The quantity of MTJ devices of each of the device strings is equal to the quantity of device strings. The equivalent resistance of the MTJ devices is equal to the resistance of one of the MTJ devices.

In some embodiments, an MRAM is provided. The MRAM includes a plurality of memory cells arranged in a plurality of rows and a plurality of columns of a memory array and a sense amplifier. Each of the memory cells includes a magnetic tunnel junction (MTJ) device, and the memory cells are divided into a plurality of first cells and a plurality of second cells. The sense amplifier includes a first input terminal coupled to one of the first cells via a bit line, a second input terminal coupled to a reference circuit via a reference line, and an output terminal for providing a comparing result according to a voltage difference between the reference line and the bit line. The reference circuit includes a plurality of device strings coupled in parallel. Each device string includes a portion of the second cells coupled in serial. The quantity of second cells of each of the device strings is equal to the quantity of device strings, and all of the second cells are in a specific magnetic state.

In some embodiments, another MRAM is provided. The MRAM includes a plurality of memory cells arranged in a plurality of rows and a plurality of columns of a memory array, a reference circuit including a plurality of device strings coupled in parallel, and a plurality of sense amplifiers. Each of the memory cells includes a magnetic tunnel junction (MTJ) device, and the memory cells are divided into a plurality of first cells and a plurality of second cells. Each of the device strings includes a portion of second cells coupled in serial. each of the sense amplifiers includes a first input terminal coupled to one of the first cells via an individual bit line, a second input terminal coupled to one of the device strings of the reference circuit via an individual reference line, and an output terminal for providing a comparing result according to the voltage difference between the individual reference line and the individual bit line. The quantity of device strings is equal to the quantity of sense amplifiers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A reference circuit for a magnetic random access memory (MRAM), comprising:
   A plurality of device strings coupled in parallel, each comprising a plurality of magnetic tunnel junction (MTJ) devices coupled in serial,
   wherein a quantity of the MTJ devices of each of the device strings is equal to a quantity of the device strings,
   wherein an equivalent resistance of the MTJ devices is equal to a resistance of one of the MTJ devices.

2. The reference circuit as claimed in claim 1, wherein each of the MTJ devices is in a parallel magnetic state with a low resistance, and the equivalent resistance of the MTJ devices is equal to the low resistance.

3. The reference circuit as claimed in claim 1, wherein each of the MTJ devices is in an anti-parallel magnetic state with a high resistance, and the equivalent resistance of the MTJ devices is equal to the high resistance.

4. The reference circuit as claimed in claim 1, wherein each of the MTJ devices comprises a free layer and a pinned layer, and the free layer of each of the MTJ devices is coupled to the pinned layer of the adjacent MTJ device in each of the device strings.

5. A magnetic random access memory (MRAM), comprising:
   a plurality of memory cells arranged in a plurality of rows and a plurality of columns of a memory array, wherein each of the memory cells comprises a magnetic tunnel junction (MTJ) device, and the memory cells are divided into a plurality of first cells and a plurality of second cells; and
   a sense amplifier, comprising a first input terminal coupled to one of the first cells via a bit line, a second input terminal coupled to a reference circuit via a reference line, and an output terminal for providing a comparing result according to a voltage difference between the reference line and the bit line,
   wherein the reference circuit comprises:
   a plurality of device strings coupled in parallel, each comprising a portion of the second cells coupled in serial,
   wherein a quantity of the second cells of each of the device strings is equal to a quantity of the device strings, and all of the second cells are in a specific magnetic state.

6. The MRAM as claimed in claim 5, wherein an equivalent resistance of the second cells of the reference circuit is equal to a resistance of one of the second cells.

7. The MRAM as claimed in claim 6, wherein the specific magnetic state is a parallel magnetic state with a low resistance, and the equivalent resistance of the second cells of the reference circuit is equal to the low resistance.

8. The MRAM as claimed in claim 6, wherein the specific magnetic state is in an anti-parallel magnetic state with a high resistance, and the equivalent resistance of the second cells of the reference circuit is equal to the high resistance.

9. The MRAM as claimed in claim 5, wherein each of the second cells comprises a free layer and a pinned layer, and the free layer of each of the second cells is coupled to the pinned layer of the adjacent second cell in each of the device strings.

10. The MRAM as claimed in claim 5, wherein a read current flowing through the one of the first cells is larger than a reference current flowing through the reference lines in each of the device strings of the reference circuit.

11. The MRAM as claimed in claim 5, further comprising:
    a refreshing circuit, periodically providing a refreshing current to the second cells of the reference circuit via the reference line, to refresh the specific magnetic state of each of the second cells.

12. The MRAM as claimed in claim 5, wherein the second cells are arranged in a sub-array of the memory array, and a quantity of first cells is larger than a quantity of second cells in the memory array.

13. A magnetic random access memory (MRAM), comprising:
    a plurality of memory cells arranged in a plurality of rows and a plurality of columns of a memory array, wherein each of the memory cells comprises a magnetic tunnel junction (MTJ) device, and the memory cells are divided into a plurality of first cells and a plurality of second cells;

a reference circuit comprising a plurality of device strings coupled in parallel, wherein each of the device strings comprising a portion of the second cells coupled in serial; and a plurality of sense amplifiers, each comprising a first input terminal coupled to one of the first cells via an individual bit line, a second input terminal coupled to one of the device strings of the reference circuit via an individual reference line, and an output terminal for providing a comparing result according to a voltage difference between the individual reference line and the individual bit line, wherein a quantity of the device strings is equal to a quantity of the sense amplifiers.

14. The MRAM as claimed in claim 13, wherein a quantity of the second cells of each of the device strings is equal to the quantity of the device strings, and all of the second cells are in a specific magnetic state.

15. The MRAM as claimed in claim 14, wherein the specific magnetic state is a parallel magnetic state with a low resistance, and the equivalent resistance of the second cells of the reference circuit is equal to the low resistance.

16. The MRAM as claimed in claim 14, wherein the specific magnetic state is in an anti-parallel magnetic state with a high resistance, and the equivalent resistance of the second cells of the reference circuit is equal to the high resistance.

17. The MRAM as claimed in claim 13, wherein a quantity of the second cells of each of the device strings is different from the quantity of the device strings, and the quantity of the device strings is even number.

18. The MRAM as claimed in claim 17, wherein the second cells of half of the device strings are in a parallel magnetic state, and the second cells of the other half of the device strings are in an anti-parallel magnetic state.

19. The MRAM as claimed in claim 13, further comprising:

a refreshing circuit, periodically providing a plurality of refreshing currents to refresh the second cells of the reference circuit via the individual reference lines.

20. The MRAM as claimed in claim 13, wherein the second cells are arranged in a sub-array of the memory array, and a plurality of first cells is larger than a plurality of second cells in the memory array.

* * * * *